United States Patent
Ha et al.

(10) Patent No.: US 7,634,697 B2
(45) Date of Patent: Dec. 15, 2009

(54) SEMICONDUCTOR MEMORY DEVICE, MEMORY SYSTEM HAVING SEMICONDUCTOR MEMORY DEVICE, AND METHOD FOR TESTING MEMORY SYSTEM

(75) Inventors: Kae-Won Ha, Seongnam-si (KR); Dong-Jun Kim, Suwon-si (KR); Jin-Soo Park, Seoul (KR); Keun-Soo Jo, Gwacheon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 262 days.

(21) Appl. No.: 11/853,107

(22) Filed: Sep. 11, 2007

(65) Prior Publication Data

US 2008/0080268 A1 Apr. 3, 2008

(51) Int. Cl.
*G11C 29/00* (2006.01)

(52) U.S. Cl. ........................ 714/718; 711/154
(58) Field of Classification Search ................. 714/718, 714/712, 763; 711/154; 365/201
See application file for complete search history.

(56) References Cited

U.S. PATENT DOCUMENTS

| 2003/0095455 | A1* | 5/2003 | Dono et al. .................. 365/200 |
| 2007/0180202 | A1* | 8/2007 | Kawabata et al. ............ 711/154 |
| 2009/0063916 | A1* | 3/2009 | Vogelsang .................. 714/719 |

FOREIGN PATENT DOCUMENTS

| JP | 06052694 A | 2/1994 |
| JP | 2003256232 A | 9/2003 |
| JP | 2005107599 A | 4/2005 |
| KR | 1020040020807 A | 3/2004 |
| KR | 1020040095892 A | 11/2004 |
| KR | 1020060073045 A | 6/2006 |

* cited by examiner

*Primary Examiner*—Vu A Le
(74) *Attorney, Agent, or Firm*—Volentine & Whitt, PLLC

(57) ABSTRACT

Embodiments of the invention include features in the semiconductor memory device that are configured to receive command signals from a memory controller and selectively output at least a portion of the received command signals back to the memory controller for verification. Embodiments of the invention also provide methods for verifying the proper communication of command signals from a memory controller to a semiconductor memory device. Embodiments of the invention also provide systems and methods for testing memory cells in a semiconductor memory device.

25 Claims, 6 Drawing Sheets

SEMICONDUCTOR MEMORY DEVICE, MEMORY SYSTEM HAVING SEMICONDUCTOR MEMORY DEVICE, AND METHOD FOR TESTING MEMORY SYSTEM

CROSS-REFERENCE TO RELATED APPLICATION

This application claims the benefit of Korean Patent Application No. 2006-87481, filed Sep. 11, 2006, the disclosure of which is hereby incorporated herein by reference in its entirety.

BACKGROUND OF THE INVENTION

1. Field of the Invention

The present invention relates generally to semiconductor memory devices, and more particularly, but not by way of limitation, to semiconductor memory devices with command signal testing features, and to methods for testing command signals that are received in a semiconductor memory device.

2. Description of the Related Art

A typical memory system comprises a semiconductor memory device (or memory module) and a memory controller. The semiconductor memory device stores data or outputs the stored data in response to a command signal applied from the memory controller. The typical memory system performs a test for all memory cells of the semiconductor memory device during a test operation to identify an address of a normal memory cell and an address of a defective memory cell.

However, errors may occur in the communication of command signals from a memory controller to a semiconductor memory device. For example, the memory controller may apply an inappropriate command, or noise may corrupt the command signals during transmission. Such errors may cause an abnormal operation of the semiconductor memory device, resulting in poor performance of the memory system.

For the foregoing reasons, there is an urgent need for testing whether command signals of the memory system are properly communicated from the memory controller to the semiconductor memory device.

SUMMARY OF THE INVENTION

Embodiments of the invention include features in the semiconductor memory device that are configured to receive command signals from a memory controller and selectively output at least a portion of the received command signals back to the memory controller for verification. Embodiments of the invention also provide methods for verifying the proper communication of command signals from a memory controller to a semiconductor memory device. Embodiments of the invention also provide systems and methods for testing memory cells in a semiconductor memory device.

One aspect of the invention provides a semiconductor memory device that includes the at least one internal command signals being associated with a corresponding at least one external command signal a command decoder for decoding command signals applied from an external portion to generate a plurality of commands and a mode setting command; a mode setting portion for receiving a mode setting code applied from the external portion to set a state of a command test enable signal in response to the mode setting command; a selecting signal generator for activating a selecting signal when the state of the command test enable signal is an enable state; and a selector for receiving internal command signals and outputting the internal command signals to the external portion when the selecting signal is activated.

The semiconductor memory device further comprises a command buffer for buffering a command signal applied from the external portion to generate a buffered command signal; and a data output buffer for buffering a signal outputted from the selector and outputting the signal to the external portion, wherein the command decoder decodes the buffered command signal. The selecting signal generator inactivates the selecting signal when the state of the command test enable signal is a disable state, and the selector selects and outputs the buffered command signal as the internal command signal when the selecting signal is activated and selects and outputs internally generated output data when the selecting signal is inactivated.

The semiconductor memory device further comprises a command encoder for receiving and encoding the plurality of commands and the mode setting command to generate the internal command signals.

The selecting signal generator inactivates the selecting signal when the state of the command test enable signal is a disable state, and the selector selects and outputs the internal command signal when the selecting signal is activated and selects and outputs internally generated output data when the selecting signal is inactivated.

Another aspect of the present invention provides a semiconductor memory device, comprising: a command decoder for decoding a command signal applied from an external portion to generate a plurality of commands and a mode setting command; a mode setting portion for receiving a mode setting code applied from the external portion to set a state of a command test enable signal and a state of a memory cell test enable signal in response to the mode setting command; a selecting signal generator for activating a selecting signal when an address applied from the external portion is a set address in case where the state of the command test enable signal and the state of the memory cell test enable signal are an enable state; and a selector for receiving internal command signals and outputting the internal command signals to the external portion when the selecting signal is activated.

The semiconductor memory device further comprises a command buffer for buffering a command signal applied from the external portion to generate a buffered command signal; and a data output buffer for buffering a signal outputted from the selector and outputting the signal to the external portion, wherein the command decoder decodes the buffered command signal.

The selecting signal generator activates the selecting signal when the state of the command test enable signal is the enable state and the state of the memory cell test enable signal is a disable state and inactivates the selecting signal when the state of the command test enable signal and the state of the memory cell test enable signal are the enable states and the address applied from the external portion is not the set address, and the selector selects and outputs the buffered command signal as the internal command signal when the selecting signal is activated and selects and outputs internally generated output data when the selecting signal is inactivated.

The semiconductor memory device further comprises a command encoder for receiving and encoding the plurality of commands and the mode setting command to generate the internal command signals.

The selecting signal generator activates the selecting signal when the state of the command test enable signal is the enable state and the state of the memory cell test enable signal is a disable state and inactivates the selecting signal when the state of the command test enable signal is the disable state or both the state of the command test enable signal and the state of the memory cell test enable signal are the enable states and the address applied from the external portion is not the set address, and the selector selects and outputs the internal command signal when the selecting signal is activated and selects and outputs internally generated output data when the selecting signal is inactivated.

The command signal contains a bank address.

The command decoder decodes the command signal to generate at least two mode setting commands, and the mode setting portion sets the command test enable signal in response to one of the at least two mode setting commands and sets the memory cell test enable signal in response to the other of the at least two mode setting commands.

One aspect of the present invention further provides a memory system, comprising: a semiconductor memory device for receiving a mode setting code to set a state of a command test enable signal when a command signal is a mode setting command, and receiving command signals applied from an external portion and generating the received command signals as an internal command signal to be outputted to the external portion when the state of the command test enable signal is an enable state; and a memory controller for applying a command signal for the mode setting command and the mode setting code to the semiconductor memory device, applying the command signals to the semiconductor memory device, and receiving the command signals outputted from the semiconductor memory device.

One aspect of the present invention further provides a memory system, comprising: a semiconductor memory device for receiving a mode setting code to set a state of a command test enable signal and a state of a memory cell test enable signal when a command signal is a mode setting command, receiving command signals applied from an external portion and generating the received command signals as an internal command signal to be outputted to the external portion when the state of the command test enable signal is an enable state, and receiving command signals and an address applied from an external portion and generating the received command signals as the internal command signal to be outputted to the external portion when the address is a set address in case where both the state of the command test enable signal and the state of the memory cell test enable signal are an enable state; and a memory controller for applying a command signal for the mode setting command and the mode setting code to the semiconductor memory device, applying the command signals and the address to the semiconductor memory device, and receiving the command signals outputted from the semiconductor memory device.

The present invention further provides a method for testing a memory system, comprising: at a memory controller, applying a command signal and a mode setting code for a mode setting command to a semiconductor memory device; at the semiconductor memory device, receiving the command signal and the mode setting code to set a state of a command test enable signal; at the memory controller, applying the command signal to the semiconductor memory device; and at the semiconductor memory device, receiving the command signal and generating the received command signal as an internal command signal to be outputted to the memory controller when the state of the command test enable signal is an enable state.

The present invention further provides a method for testing a memory system, comprising: at a memory controller, applying a command signal and a mode setting code for a mode setting command to a semiconductor memory device; at the semiconductor memory device, receiving the command signal and the mode setting code to set a state of a command test enable signal and a state of a memory cell test enable signal; at the memory controller, applying a command signal and an address to the semiconductor memory device; and at the semiconductor memory device, receiving command signals applied from an external portion and generating the received command signals as an internal command signal to be outputted to the memory controller when the state of the command test enable signal is an enable state, and receiving command signals and an address applied from an external portion and generating the received command signals as an internal command signal to be outputted to the external portion when both the state of the command test enable signal the state of the memory cell enable signal are the enable state and the address is a set address.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout the specification.

Figure 1:
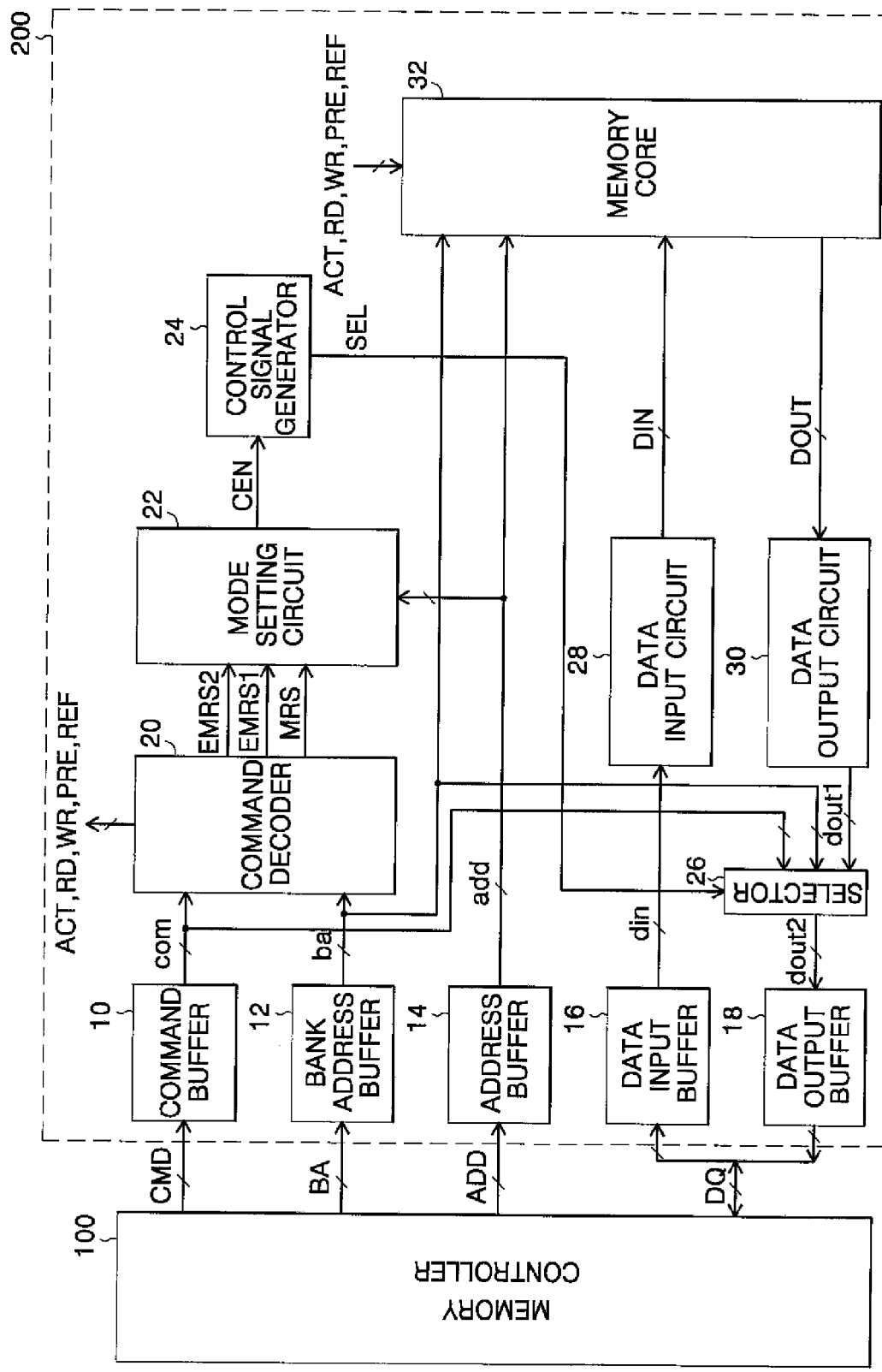
FIG. 1 is a block diagram illustrating a memory system according to an exemplary embodiment of the invention.

FIG. 1 is a block diagram illustrating a memory system according to an exemplary embodiment of the invention. The memory system of FIG. 1 includes a memory controller 100 coupled to a semiconductor memory device 200. The semiconductor memory device 200 includes a command buffer 10, a bank address buffer 12, an address buffer 14, a data input buffer 16, and a data output buffer 18, each coupled to the memory controller 100. The semiconductor memory device 200 further includes a command decoder 20 coupled to the command buffer 10 and the bank address buffer 12, a mode setting circuit 22 coupled to the command decoder 20 and the address buffer 14, and a control signal generator 24 coupled to the mode setting circuit 22. The semiconductor memory 200 further includes a selector 26 coupled to the control signal generator 24, a data input circuit 28 coupled to the data input buffer 16, a data output circuit 30 coupled to the selector 26.

The semiconductor memory 200 also includes a memory core 32 coupled to the bank address buffer 12, the address buffer 14, the command decoder 20, the data input circuit 28, and the data output circuit 30. Even though not shown, the memory core 32 may include multiple memory cell array banks, a row address decoder, and a column address decoder.

Functions of the components of FIG. 1 are described below.

The memory controller 100 applies a command signal CMD, a bank address BA, an address signal ADD, and data DQ to the semiconductor memory device 200, and receives the data DQ outputted from the semiconductor memory device 200. The memory controller 100 is also configured to output data DQ to the semiconductor memory device 200.

The command buffer 10 buffers the command signal CMD to generate a buffered command signal com. The bank address buffer 12 buffers the bank address BA to generate a buffered bank address ba. The address buffer 14 buffers the address ADD to generate a buffered address add. The data input buffer 16 buffers the data DQ from the memory controller 100 to generate buffered input data din. The data output buffer 28 buffers output data dout2 to generate the data DQ being output from the semiconductor memory device 200 to the memory controller 100.

The command decoder 20 decodes the buffered command signal com and the buffered bank address ba to generate an active command ACT, a read command RD, a write command WR, a precharge command PRE, a refresh command REF, and mode setting commands EMRS2, EMRS1 and MRS. The command decoder 20 determines the mode setting commands EMRS2, EMRS1 and MRS according to the bank address ba when the buffered command signal com for mode setting is applied.

The mode setting circuit 22 receives the mode setting command EMRS2 and the buffered address add to set a command test enable signal CEN (here, the buffered address add is used as a mode setting code). In an alternative embodiment, the mode setting circuit 22 sets the command test enable signal CEN in response to mode setting commands EMRS1 and/or MRS.

The control signal generator 24 activates a selecting signal SEL when the command test enable signal CEN is set to an enable state. The selector 26 selects the buffered command signal com and the buffered bank address ba to be outputted as the output data dout2 when the selecting signal SEL is activated, and generates output data dout1 as the output data dout2 when the selecting signal SEL is inactivated.

The data input circuit 28 processes the buffered input data din to generate data DIN. The data output circuit 30 processes data DOUT to generate the output data dout1.

The memory core 32 decodes the buffered bank address ba and the buffered address add to select one of a plurality of memory cell array banks (not shown) in response to the active command ACT, activates a corresponding word line among a plurality of word lines (not shown) of the selected memory cell array bank, and decodes the buffered address add to a corresponding bit line pair among a plurality of bit line pairs in response to the read command RD or the write command WR. Thus, the memory core 32 accesses the memory cells (not shown) connected between the corresponding word line and the corresponding bit line pair of the selected memory cell array bank to write the data DIN during a write operation or to output the data DOUT during a read operation. The memory core 32 performs a precharge operation for a plurality of bit line pairs in response to the precharge command PRE, and performs a refresh operation for the memory cells connected to the corresponding word line in response to the refresh operation REF.

The semiconductor memory device of FIG. 1 is therefore configured to output the buffered command signal com and the buffered bank address ba as the output data dout2 through the selector 26 and the data output buffer 18 when the command test enable signal CEN is set to the enable state. The memory controller 100 is configured to compare the applied command signal CMD and bank address BA to the output data dout2. In particular, the memory controller 100 can compare command signal CMD to a first portion of data DQ received from the semiconductor memory device 200, the first portion of data DQ being associated with buffered command signal com. In addition, the memory controller 100 can compare the bank address BA to a second portion of the data DQ received from the semiconductor memory device 200, the second portion of the data DQ being associated with the buffered bank address ba. The memory controller 100 can determine that there is no error in communication of command signals to the semiconductor memory device 200 when the above comparisons each result in a match. On the other hand, the memory controller 100 can determine that there is an error in communication of command signals to the semiconductor memory device 200 when one or both of the above comparisons result in a mismatch.

Variations to the semiconductor memory device 200 are possible. For example, in an alternative embodiment (not illustrated), the control signal generator 24 is deleted and the selector 26 is responsive to the command test enable signal CEN instead of the selecting signal SEL.

Figure 2:
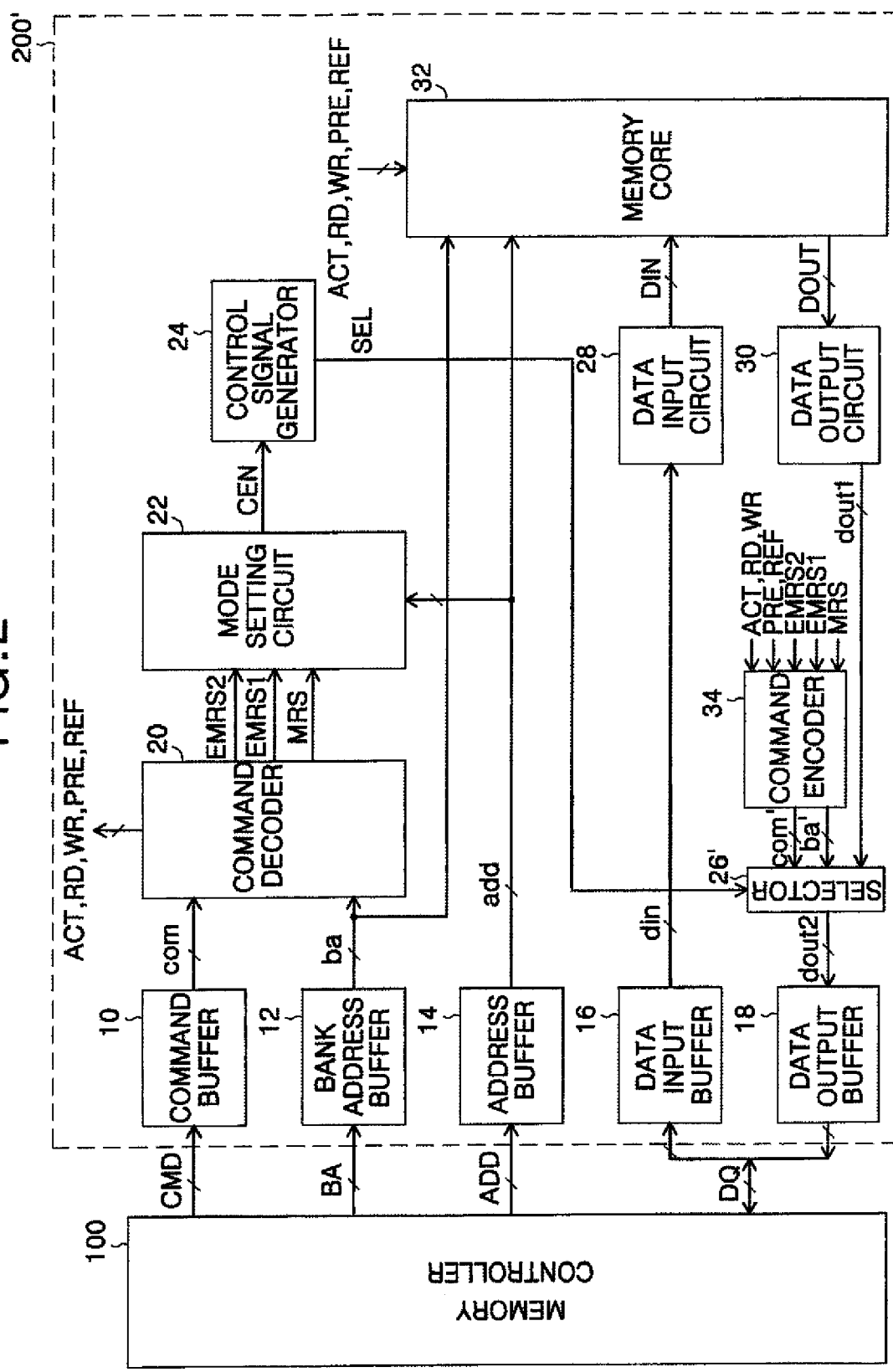
FIG. 2 is a block diagram illustrating a memory system according to an exemplary embodiment of the invention.

FIG. 2 is a block diagram illustrating a memory system according to an exemplary embodiment of the invention. The memory system of FIG. 2 comprises a memory controller 100 and a semiconductor memory device 200'. The semiconductor memory device 200' is changed from the semiconductor memory device 200 in FIG. 1 by adding a command encoder 34 and by replacing the selector 26 with a selector 26'.

Functions of the new components of FIG. 2 are described below.

The command encoder 34 encodes the command signals ACT, RD, WR, PRE, REF, EMRS2, EMRS1, and MRS generated from the command decoder 20 to generate a command signal com' and a bank address ba'. The selector 26' selects the command signal com' and the bank address ba' to be outputted as the output data dout2 when the selecting signal SEL is activated, and generates the output data dout1 as the output data dout2 when the selecting signal SEL is inactivated. The semiconductor memory device 200' is configured to activate selecting signal SEL when the command test enable signal CEN is set to the enable state.

The semiconductor memory device 200' of FIG. 2 outputs the output data dout2 through the selector 26' and the data output buffer 18. The memory controller 100 is configured to compare the applied command signal CMD and bank address BA to the data DQ. In particular, the memory controller 100 can compare command signal CMD to a first portion of data DQ received from the semiconductor memory device 200, the first portion of data DQ being associated with buffered command signal com'. In addition, the memory controller 100 can compare the bank address BA to a second portion of the data DQ received from the semiconductor memory device 200, the second portion of the data DQ being associated with the buffered bank address ba'. The memory controller 100 can determine that there is no error in communication of command signals to the semiconductor memory device 200 when the above comparisons each result in a match. On the other hand, the memory controller 100 can determine that there is an error in communication of command signals to the semiconductor memory device 200 when one or both of the above comparisons result in a mismatch.

The semiconductor memory device 200' may be advantageous to the semiconductor memory device 200 because the semiconductor memory device 200' is configured to also test the operation of the command decoder 20 in a command test mode. In particular, if the command decoder 20 improperly decodes buffered command signal com and buffered bank address ba, then the command encoder 34 will produce an erroneous buffered command signal com' and/or an erroneous buffered bank address ba', and one or more comparisons performed by the memory controller 100 will result in a mismatch.

Variations to the semiconductor memory device 200' are possible. For example, in an alternative embodiment (not illustrated), the control signal generator 24 is deleted and the selector 26' is responsive to the command test enable signal CEN instead of the selecting signal SEL.

Figure 3:
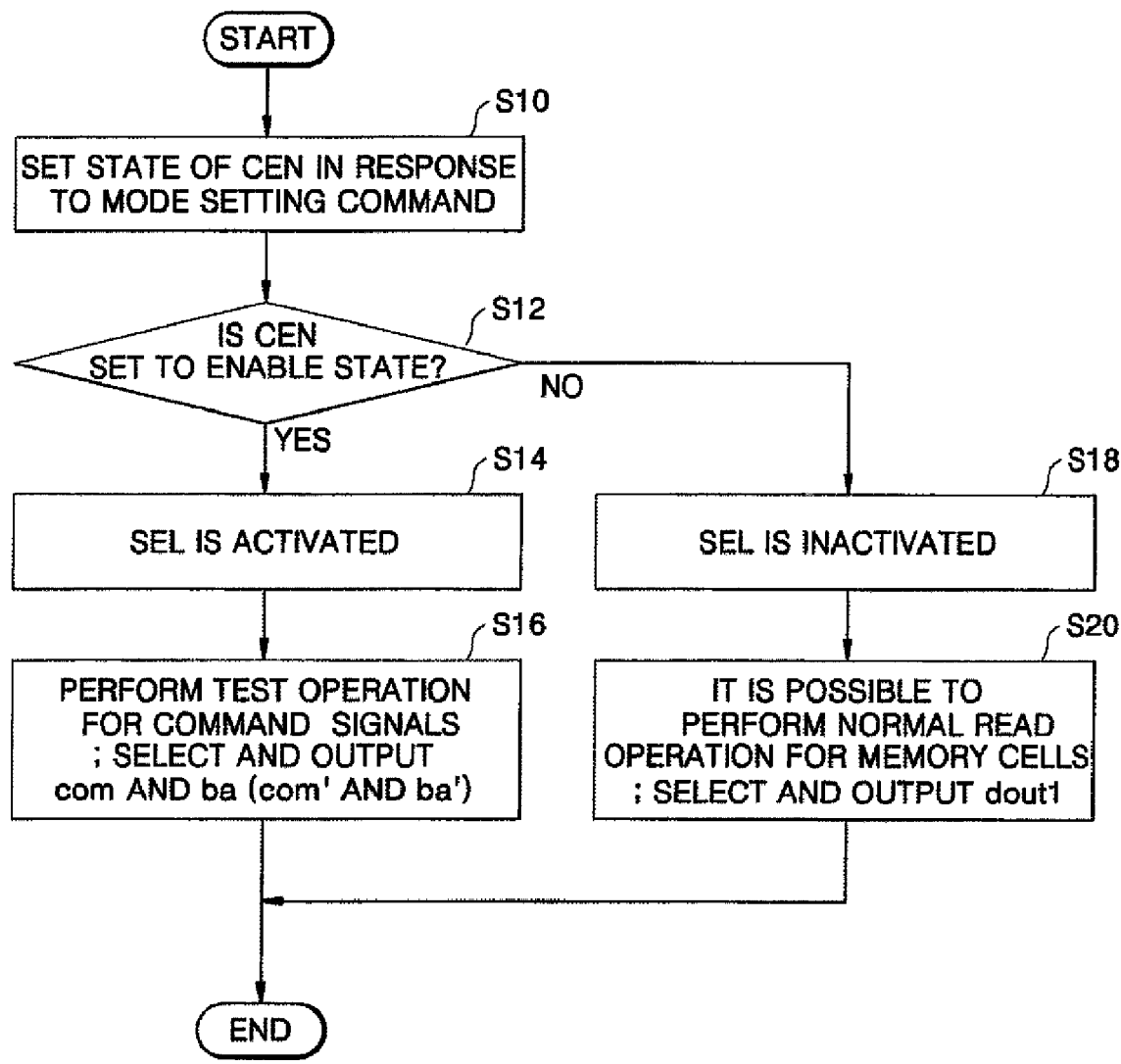
FIG. 3 is a flowchart illustrating an operation of the semiconductor memory devices of the memory system in FIGS. 1 and 2, according to an exemplary embodiment of the invention.

FIG. 3 is a flowchart illustrating an operation of the semiconductor memory devices of the memory system in FIGS. 1 and 2, according to an exemplary embodiment of the invention.

First, the process sets a state of the command test enable signal CEN is in response to the mode setting command in step S10. In conditional step S12, the process determines whether the state of the command test enable signal CEN is the enable state. Where it is determined in conditional step S12 that the command test enable signal CEN is in an enable state, the process activates selecting signal SEL in step S14 and tests command signal communications by outputting data associated with the buffered command signal com (or com') and the buffered bank address ba (or ba') to the memory controller in step S16. On the other hand, where it is determined in step S12 that the command test enable signal CEN is not in an enable state, the process inactivates the selecting signal SEL in step S18 and optionally performs a normal read operation by outputting the data associated with output dout1 to the memory controller in step S20.

Accordingly, the semiconductor memory devices of FIGS. 1 and 2 utilize the command signal CMD and the bank address BA supplied by the memory controller 100 to generate all internal commands, and will test whether the command signal CMD and the bank address BA are correctly transmitted and received without any error when the command test enable signal CEN is set to the enable state.

Variations to the process illustrated in FIG. 3 are possible. For example, in an alternative embodiment (not illustrated), steps S14 and S18 are eliminated, step S16 is performed where there is an affirmative result in conditional step S12, and step S20 is performed where there is a negative result in conditional step S12.

Figure 4:
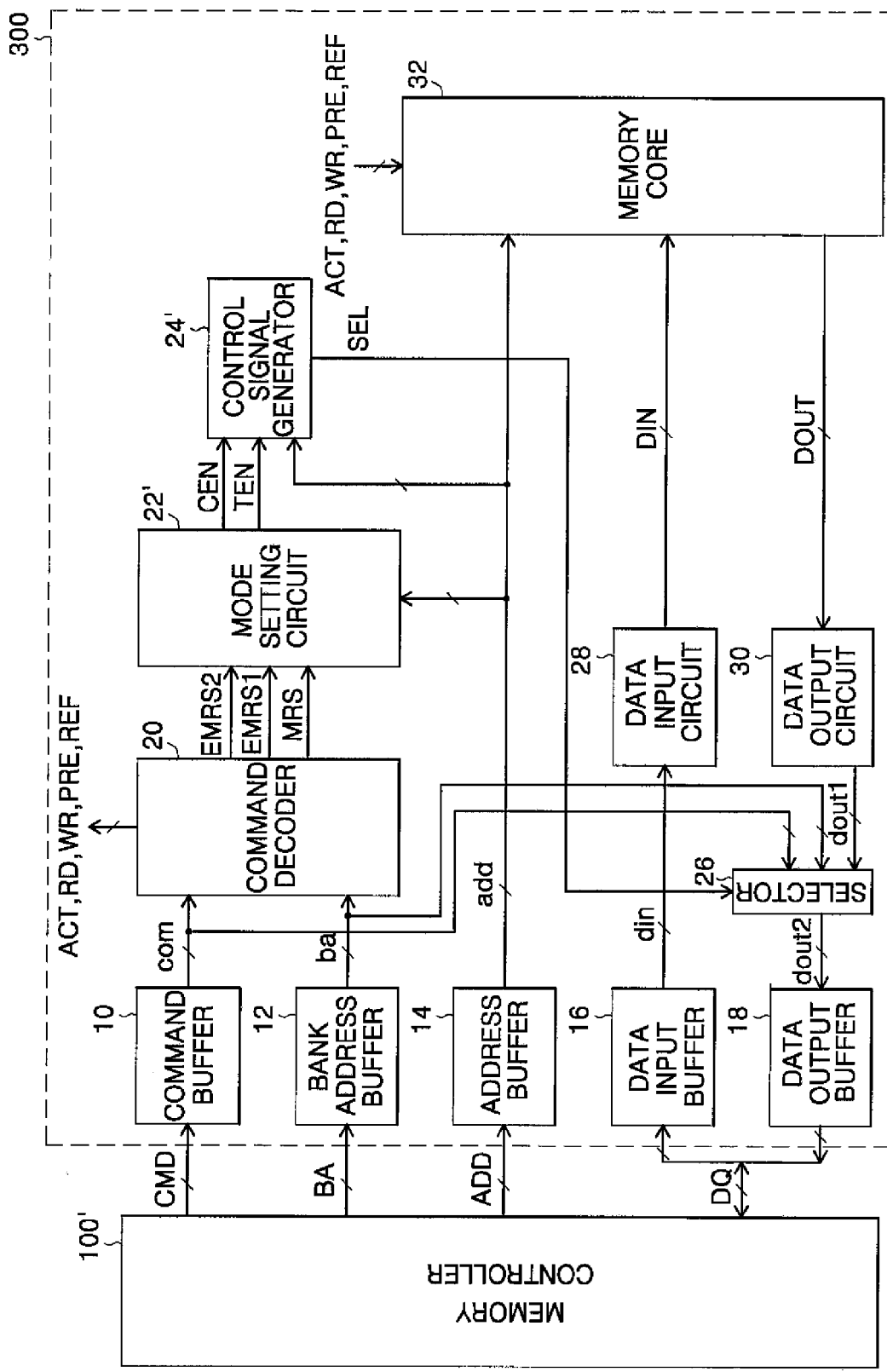
FIG. 4 is a block diagram illustrating a memory system according to an exemplary embodiment of the invention.

FIG. 4 is a block diagram illustrating a memory system according to an exemplary embodiment of the invention. The memory system of FIG. 4 comprises a memory controller 100' and a semiconductor memory device 300. The semiconductor memory device 300 is changed from the memory device 200 in FIG. 1 by replacing the mode setting circuit 22 with a mode setting circuit 22' and by replacing the control signal generator 24 with a control signal generator 24'. In the semiconductor memory device 300, the mode setting circuit 22' outputs a memory test enable signal TEN to the control signal generator 24'. In addition, the control signal generator 24' is configured to receive the buffered address add.

Functions of the new components of FIG. 4 are described below.

The mode setting circuit 22' receives the buffered address add to set the command test enable signal CEN in response to the mode setting command EMRS2, and receives the buffered address add to set a memory cell test enable signal TEN in response to the mode setting command MRS. In alternative embodiments, the command test enable signal CEN may be set in response to mode setting commands EMRS1 and/or MRS, and the memory cell test enable signal TEN may be set in response to mode setting commands EMRS1 and/or EMRS2.

The control signal generator 24' activates the selecting signal SEL when the command test enable signal CEN is set to the enable state and the memory cell test enable signal TEN is set to the disable state. The control signal generator 24' also activates the selecting signal SEL when the command test enable signal CEN and the memory cell test enable signal TEN are set to the enable state and the buffered address add is a certain (predetermined) address. The control signal generator 24' disables the selecting signal SEL when the command test enable signal CEN is set to the disable state.

The test is performed when the command test enable signal CEN is set to the enable state and the memory cell test enable signal TEN is set to the disable state. In this instance, the command test operation is performed while the memory controller 100' applies different command signals CMD.

Either the command test or the memory test may be performed when the command test enable signal CEN and the memory cell test enable signal TEN are set to the enable state, based on the buffered address add. In this instance, the memory controller 100' normally applies the command signal CMD, the bank address BA and the address ADD which instruct the active command ACT in order to perform the test operation for the memory cells, and then applies the command signal CMD, the bank address BA and the address ADD which instruct the write command WR to thereby write data onto the corresponding memory cells of the selected bank of the memory core 32. Subsequently, the memory controller 100' applies the command signal CMD, the bank address BA and the address ADD which instruct the read command RD to thereby read data from the corresponding memory cells of the selected bank of the memory core 32 to complete a memory test operation. In this same state (when both the command test enable signal CEN and the memory test enable signal TEN are enabled), and when the memory controller 100' also outputs a certain (predetermined) address, the semiconductor memory device 300 outputs the buffered command signal com and the buffered bank address ba as the data DQ through the selector 26 and the data output buffer 18.

During the test operation for the memory cells, the memory controller 100' determines that the corresponding cell is normal when data written on the corresponding memory cell are identical to data read from the corresponding memory cell and the memory controller 100' determines that the corresponding cell is defective when data written on the corresponding memory cell are not identical to data read from the corresponding memory cell. During the test operation for the command signal, the memory controller 100' determines that the command signal communications are normal when the command signal CMD and the band address BA which are applied together with a certain (predetermined) address are identical to data DQ outputted from the semiconductor memory device 300 and the memory controller 100' determines that the command signal communications are defective when the command signal CMD and the band address BA which are applied together with a certain (predetermined) address are not identical to data DQ outputted from the semiconductor memory device 300.

Figure 5:
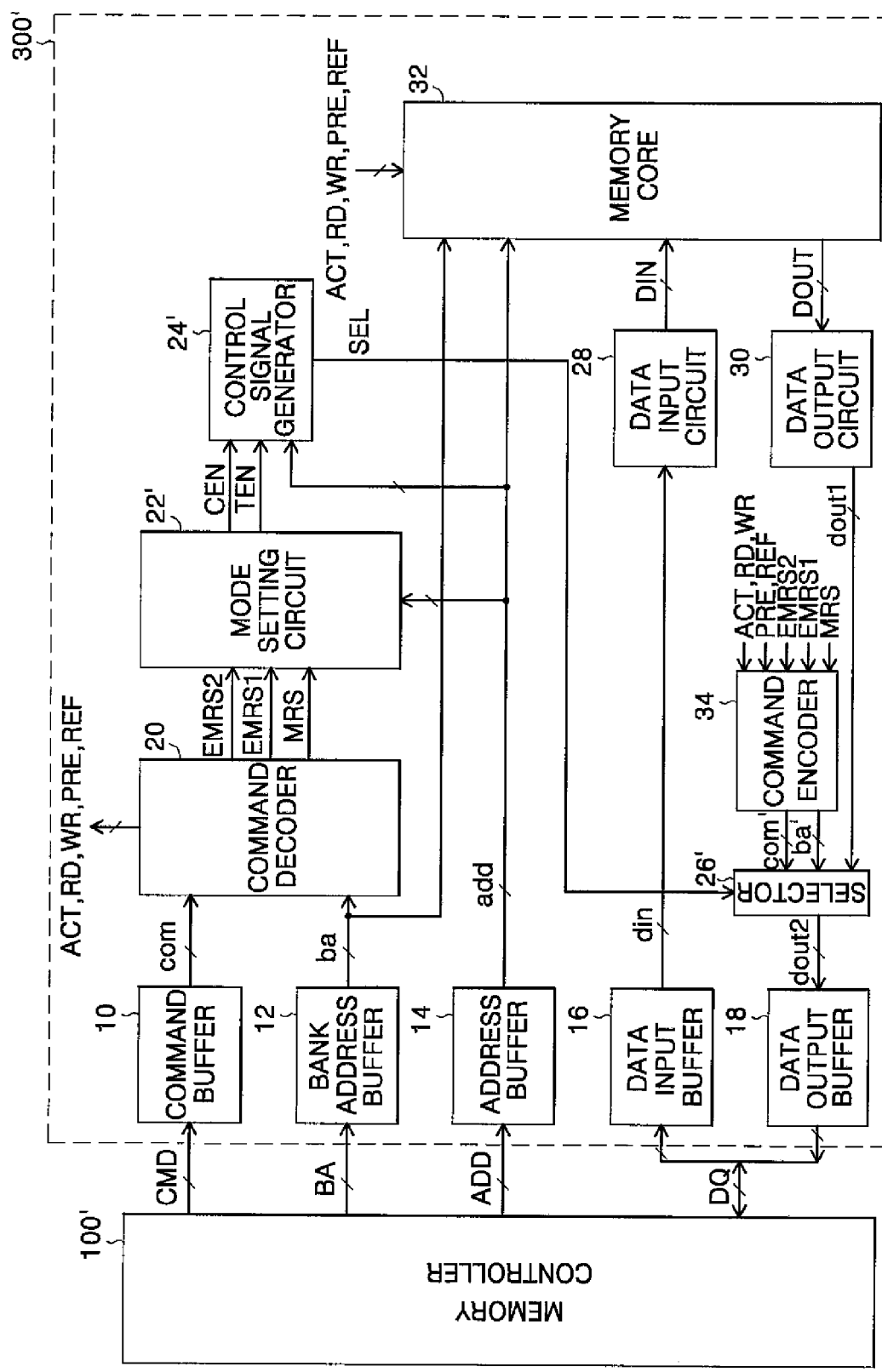
FIG. 5 is a block diagram illustrating a memory system according to an exemplary embodiment of the invention.

FIG. 5 is a block diagram illustrating a memory system according to an exemplary embodiment of the invention. The memory system of FIG. 5 includes a memory controller 100' and a semiconductor memory device 300'. The semiconductor memory device 300' is changed from the semiconductor memory device 300 in FIG. 4 by adding a command encoder 34 and replacing the selector 26 with a selector 26'.

The command encoder 34 and the selector 26' of FIG. 5 perform the same function as the command encoder 34 and the selector 26' of FIG. 2, respectively.

The semiconductor memory device 300' activates the selecting signal SEL causing the command signal com' and the bank address ba' outputted from the command encoder 34 to be outputted as the data DQ through the selector 26' and the data output buffer 18 when the command test enable signal CEN is set to the enable state and the memory cell test enable signal TEN is set to the disable state during the mode setting operation. In this instance, the memory controller 100' applies only the command signal CMD and the bank address BA to the semiconductor memory device 300' to compare the command signal CMD and the bank address BA to the data DQ. The memory controller 100' determines that there is no error in command signal communications if the comparison results in a match, and the memory controller 100' determines that there is an error in command signal communications if the comparison results in a mismatch.

When the command test enable signal CEN and the memory cell test enable signal TEN are set to the enable state during the mode setting operation, either a memory test or a command test may be performed. In this state, the memory controller 100' normally applies the command signal CMD, the bank address BA, the address ADD, and the data DQ to the semiconductor memory device 300'. As a result, the data DQ is stored in the semiconductor memory core 32 as part of a memory test operation. Subsequently, the command signal CMD, the bank address BA and the address ADD are applied to the semiconductor memory device 300' from the memory controller 100', and the data DQ are outputted to the memory controller 100' from the memory core 32 as part of the memory test operation. When a certain (predetermined) address ADD is applied together with the command signal CMD and the bank address BA, however, the command signal corm and the bank address ba' are outputted from the selector 26' as dout2, and further outputted as data DQ from the semiconductor memory device 300' to the memory controller 100' as part of the command test operation.

The memory controller 100' initiates the write operation and the read operation for the memory cells included in the memory core 32. The memory controller 100' determines that the memory cells are normal when the data written onto the corresponding memory cells are identical to the data read from the corresponding memory cell in a memory test operation. The memory controller 100' determines that the memory cells are defective when the data written onto the corresponding memory cells are not identical to the data read from the corresponding memory cells during a memory test operation. Also, the memory controller 100' determines that there is no error in the command signal communications when the command signal CMD and the bank address BA applied together with the certain (predetermined) address ADD are identical to the data DQ during a command test operation. The memory controller 100' determines that there is an error in the command signal communications when the command signal CMD and the bank address BA applied together with the certain address ADD are not identical to the data DQ during a command test operation.

The semiconductor memory device of FIG. 5 inactivates the selecting signal SEL when the command test enable signal CEN is set to the disable state and the memory cell test enable signal TEN is set to the enable state during the mode setting operation. In this instance, the memory controller 100' applies the command signal CMD, the bank address BA, the address ADD, and the data DQ to the semiconductor memory device 300' in order to test the memory cells. As a result, the data DQ are stored in the semiconductor memory device 300', the command signal CMD, the bank address BA and the address ADD are applied to the semiconductor memory device 300' from the memory controller 100', and the data DQ are outputted to the memory controller 100' from the semiconductor memory device 300'.

The memory controller 100' performs the write operation and the read operation for the memory cells as part of a memory test operation, and the controller 100' determines that the memory cells are normal when the data written onto the corresponding memory cells are identical to the data read from the corresponding memory cells. The memory controller 100' determines that the memory cells are defective when the data written onto the corresponding memory cells are not identical to the data read from the corresponding memory cells. That is, when the command test enable signal CEN is disabled and the test enable signal TEN is enabled, the test for the command signal is not performed, and only the test for the memory cells is performed.

The following table summarizes the operation of the control signal generator 24' illustrated in FIGS. 4 and 5, according to an embodiment of the invention. The state of the command test enable signal (CEN), memory test enable signal (TEN), and the buffered address add are inputs, and the state of the selecting signal SEL is an output.

| CEN enabled? | TEN enabled? | add = predetermined address? | SEL activated? | Memory device 300/300' testing state |
|---|---|---|---|---|
| yes | no | don't care | yes | command test |
| yes | yes | yes | yes | command test |
| yes | yes | no | no | memory test |
| no | yes | don't care | no | memory test |
| no | no | don't care | no | no test |

Figure 6:
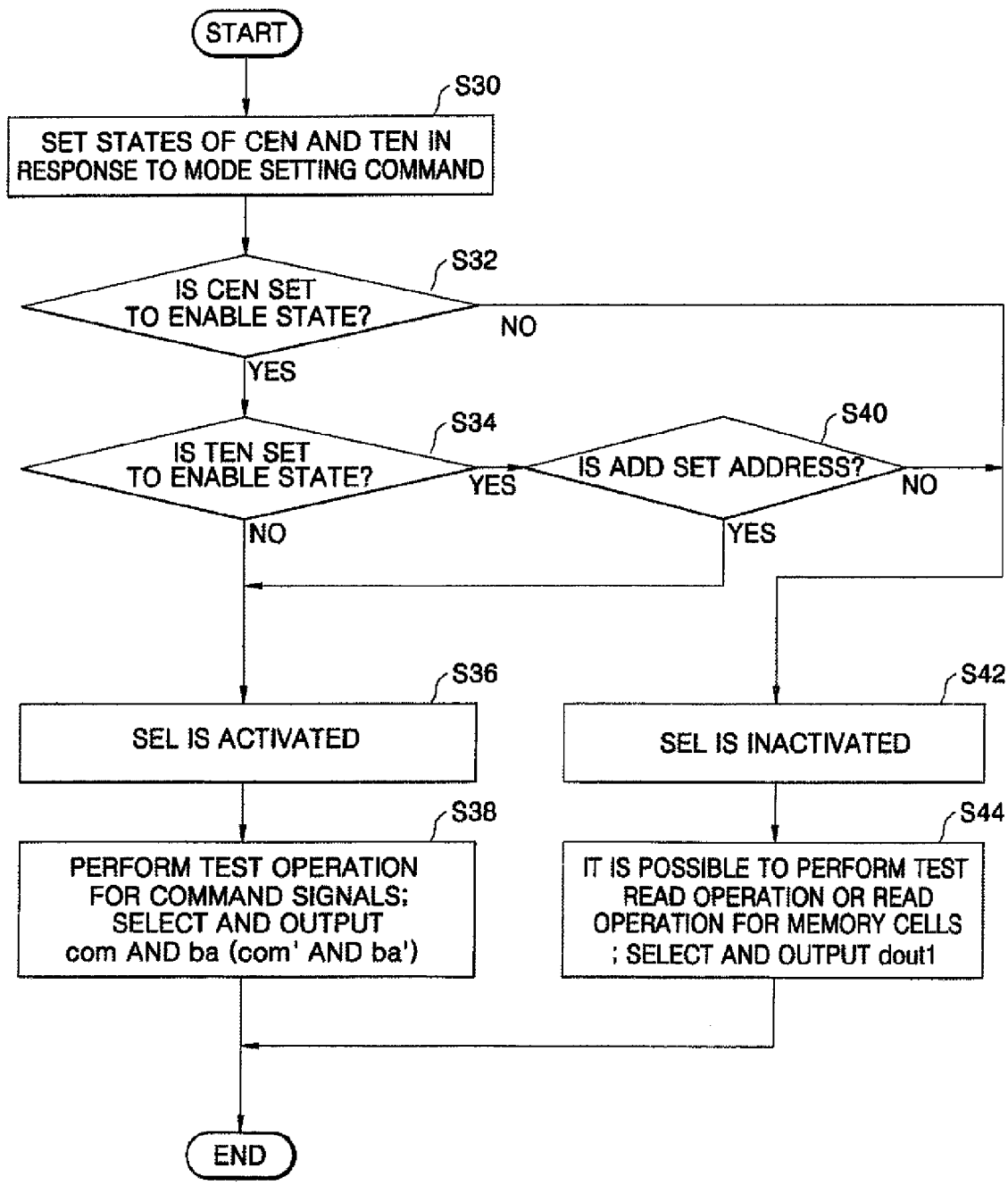
FIG. 6 is a flowchart illustrating an operation of the semiconductor memory devices of the memory system in FIGS. 4 and 5, according to an exemplary embodiment of the invention.

FIG. 6 is a flowchart illustrating an operation of the semiconductor memory devices of the memory system in FIGS. 4 and 5, according to an exemplary embodiment of the invention.

First, a state of the command test enable signal CEN and a state of the memory test enable signal TEN are set in response to the mode setting commands in step S30. In conditional step S32, the process determines whether the state of the command test enable signal CEN is the enable state. If the process determines in conditional step S32 that the state of the command test enable signal CEN is the enable state, then the process determines whether the state of the memory cell test enable signal TEN is the enable state in conditional step S34. If the process determines in conditional step S34 that the state of the memory cell test enable signal TEN is the disable state, then the selecting signal SEL is activated in step S36. As a result, the test operation for the command signals is performed. That is, the buffered command signal com and bank address ba generated by buffering the command signal CMD and the bank address BA are selected to be outputted from the semiconductor memory device in step S38.

On the other hand, as the determination result of step S34, when it is determined that the state of the memory cell test enable signal TEN is the enable state, either the test operation for the command signals or the test operation for the memory cells can be performed based on the buffered address add. In this state, the process determines whether the buffered address add is identical to a set (predetermined) address in conditional step S40. When the buffered address is equal to the set address, the process proceeds to step S36. But when the buffered address is not equal to the set address, or when the state of the command test enable signal CEN is the disable state as the determination result of step S32, the selecting signal SEL is inactivated in step S42. The test read operation or the normal read operation for the memory cells can be performed, and thus the output data dout1 are selected to be outputted, in step S44.

Accordingly, the semiconductor memory devices of FIGS. 4 and 5 can perform only the test operation for the command signals or can selectively perform the test operation for the memory cells or the test operation for the command signals, according to the state of the command test enable signal CEN and the state of the memory cell test enable signal TEN which are set in response to the mode setting commands.

The semiconductor memory devices according to the exemplary embodiments of the present invention described above, the command decoder 20 decodes the command signal CMD and the bank address BA to generate the internal commands. In an alternative embodiment, the command decoder 20 can be configured to decode only the command signal CMD to generate the internal commands.

The semiconductor memory devices according to the exemplary embodiments of the present invention described above set the command test enable signal CEN and the memory cell test enable signal TEN in response to the different mode setting commands EMRS1, EMRS2 and MRS during the mode setting operation. In an alternative embodiment, the mode setting circuit 22 (or 22') may set the command test enable signal CEN and the memory cell test enable signal TEN in response to a single mode setting command.

As described above, the semiconductor memory device of the present invention outputs the command signal com (or com') and the bank address (ba or ba') to an external portion (e.g., the memory controller) when the command signal CMD and the bank address BA are applied from the external portion (e.g., the memory controller) during the command test operation.

While the present invention has been shown and described with reference to exemplary embodiments thereof, it will be understood by those of ordinary skill in the art that various changes in form and detail may be made herein without departing from the spirit and scope of the present invention, as defined by the following claims.

What is claimed is:

1. A semiconductor memory device, comprising:
   a command decoder for decoding command signals applied from an external portion to generate a plurality of commands and a mode setting command;
   a mode setting portion for receiving a mode setting code applied from the external portion to set a state of a command test enable signal in response to the mode setting command;
   a selecting signal generator for activating a selecting signal when the state of the command test enable signal is an enable state; and
   a selector for receiving internal command signals and outputting the internal command signals to the external portion when the selecting signal is activated.

2. The semiconductor memory device of claim 1, further comprising,
   a command buffer for buffering a command signal applied from the external portion to generate a buffered command signal; and
   a data output buffer for buffering a signal outputted from the selector and outputting the signal to the external portion,
   wherein the command decoder decodes the buffered command signal.

3. The semiconductor memory device of claim 2, wherein the selecting signal generator inactivates the selecting signal when the state of the command test enable signal is a disable state, and the selector selects and outputs the buffered command signal as the internal command signal when the selecting signal is activated and selects and outputs internally generated output data when the selecting signal is inactivated.

4. The semiconductor memory device of claim 2, further comprising, a command encoder for receiving and encoding the plurality of commands and the mode setting command to generate the internal command signals.

5. The semiconductor memory device of claim 4, wherein the selecting signal generator inactivates the selecting signal when the state of the command test enable signal is a disable state, and the selector selects and outputs the internal command signal when the selecting signal is activated and selects and outputs internally generated output data when the selecting signal is inactivated.

6. The semiconductor memory device of claim 1, wherein the command signal contains a bank address.

7. A semiconductor memory device, comprising:
   a command decoder for decoding a command signal applied from an external portion to generate a plurality of commands and a mode setting command;
   a mode setting portion for receiving a mode setting code applied from the external portion to set a state of a command test enable signal and a state of a memory cell test enable signal in response to the mode setting command;
   a selecting signal generator for activating a selecting signal when an address applied from the external portion is a set address in case where the state of the command test enable signal and the state of the memory cell test enable signal are an enable state; and
   a selector for receiving internal command signals and outputting the internal command signals to the external portion when the selecting signal is activated.

8. The semiconductor memory device of claim 7, further comprising,
   a command buffer for buffering a command signal applied from the external portion to generate a buffered command signal; and
   a data output buffer for buffering a signal outputted from the selector and outputting the signal to the external portion,
   wherein the command decoder decodes the buffered command signal.

9. The semiconductor memory device of claim 8, wherein the selecting signal generator activates the selecting signal when the state of the command test enable signal is the enable state and the state of the memory cell test enable signal is a disable state and inactivates the selecting signal when the state of the command test enable signal and the state of the memory cell test enable signal are the enable states and the address applied from the external portion is not the set address, and the selector selects and outputs the buffered command signal as the internal command signal when the selecting signal is activated and selects and outputs internally generated output data when the selecting signal is inactivated.

10. The semiconductor memory device of claim 8, further comprising, a command encoder for receiving and encoding the plurality of commands and the mode setting command to generate the internal command signals.

11. The semiconductor memory device of claim 10, wherein the selecting signal generator activates the selecting signal when the state of the command test enable signal is the enable state and the state of the memory cell test enable signal is a disable state and inactivates the selecting signal when the state of the command test enable signal is the disable state or both the state of the command test enable signal and the state of the memory cell test enable signal are the enable states and the address applied from the external portion is not the set address, and the selector selects and outputs the internal command signal when the selecting signal is activated and selects and outputs internally generated output data when the selecting signal is inactivated.

12. The semiconductor memory device of claim 7, wherein the command signal contains a bank address.

13. The semiconductor memory device of claim 12, wherein the command decoder decodes the command signal to generate at least two mode setting commands, and the mode setting portion sets the command test enable signal in response to one of the at least two mode setting commands and sets the memory cell test enable signal in response to the other of the at least two mode setting commands.

14. A memory system, comprising:
  a semiconductor memory device for receiving a mode setting code to set a state of a command test enable signal when a command signal is a mode setting command, and receiving command signals applied from an external portion and generating the received command signals as an internal command signal to be outputted to the external portion when the state of the command test enable signal is an enable state; and
  a memory controller for applying a command signal for the mode setting command and the mode setting code to the semiconductor memory device, applying the command signals to the semiconductor memory device, and receiving the command signals outputted from the semiconductor memory device.

15. The memory system of claim 14, wherein the semiconductor memory device comprises
  a command decoder for decoding the command signal applied from the memory controller to generate a plurality of commands and the mode setting command;
  a mode setting portion for receiving the mode setting code to set a state of a command test enable signal in response to the mode setting command;
  a selecting signal generator for activating a selecting signal when the state of the command test enable signal is an enable state and inactivating the selecting signal when the state of the command test enable signal is a disable state; and
  a selector for selecting the internal command signal and outputting the internal command signals to the memory controller when the selecting signal is activated, and selecting internally generated output data and outputting the internally generated output data to the memory controller when the selecting signal is inactivated.

16. The memory system of claim 15, wherein the semiconductor memory device further comprises
  a command buffer for buffering a command signal applied from the external portion to generate a buffered command signal; and
  a data output buffer for buffering a signal outputted from the selector and outputting the signal to the external portion,
  wherein the command decoder decodes the buffered command signal, and the buffered command signal is the internal command signal.

17. The memory system of claim 15, wherein the semiconductor memory device further comprises
  a command buffer for buffering a command signal applied from the external portion to generate a buffered command signal;
  a data output buffer for buffering a signal outputted from the selector and outputting the signal to the external portion; and
  a command encoder for encoding the plurality of commands and the mode setting command to generate the internal command signal,
  wherein the command decoder decodes the buffered command signal.

18. A memory system, comprising:
  a semiconductor memory device for receiving a mode setting code to set a state of a command test enable signal and a state of a memory cell test enable signal when a command signal is a mode setting command, receiving command signals applied from an external portion and generating the received command signals as an internal command signal to be outputted to the external portion when the state of the command test enable signal is an enable state, and receiving command signals and an address applied from an external portion and generating the received command signals as the internal command signal to be outputted to the external portion when the address is a set address in case where both the state of the command test enable signal and the state of the memory cell test enable signal are an enable state; and
  a memory controller for applying a command signal for the mode setting command and the mode setting code to the semiconductor memory device, applying the command signals and the address to the semiconductor memory device, and receiving the command signals outputted from the semiconductor memory device.

19. The memory system of claim 18, the semiconductor memory device comprises
  a command decoder for decoding a command signal applied from the external portion to generate a plurality of commands and a mode setting command;
  a mode setting portion for receiving the mode setting code to set the state of the command test enable signal and the state of the memory cell test enable signal in response to the mode setting command;
  a selecting signal generator for activating the selecting signal when an address applied from the external portion is a set address in case where the state of the command test enable signal and the state of the memory cell test enable signal are an enable state, activating the selecting signal when the state of the command test enable signal is the enable state and the state of the memory cell test enable signal is the disable state, and inactivating the selecting signal when an address applied from the external portion is not the set address in case where the state of the command test enable signal is the disable state or the state of the command test enable signal and the state of the memory cell test enable signal are the enable state; and
  a selector for receiving internal command signals and outputting the internal command signals to the external portion when the selecting signal is activated, and selecting and outputting internally generated output data when the selecting signal is inactivated.

20. The memory system of claim 19, wherein the semiconductor memory device further comprises,
a command buffer for buffering a command signal applied from the external portion to generate a buffered command signal; and
a data output buffer for buffering a signal outputted from the selector and outputting the signal to the external portion,
wherein the command decoder decodes the buffered command signal and the buffered command signal is the internal command signal.

21. The memory system of claim 19, wherein the semiconductor memory device further comprises,
a command buffer for buffering a command signal applied from the external portion to generate a buffered command signal;
a data output buffer for buffering a signal outputted from the selector and outputting the signal to the external portion; and
a command encoder for encoding the plurality of commands and the mode setting command to generate the internal command signal,
wherein the command decoder decodes the buffered command signal.

22. The memory system of claim 18, wherein the command signal contains a bank address.

23. The memory system of claim 22, wherein the command decoder decodes the command signal to generate at least two mode setting commands, and the mode setting portion sets the command test enable signal in response to one of the at least two mode setting commands and sets the memory cell test enable signal in response to the other of the at least two mode setting commands.

24. A method for testing a memory system, comprising:
at a memory controller, applying a command signal and a mode setting code for a mode setting command to a semiconductor memory device;
at the semiconductor memory device, receiving the command signal and the mode setting code to set a state of a command test enable signal;
at the memory controller, applying the command signal to the semiconductor memory device; and
at the semiconductor memory device, receiving the command signal and generating the received command signal as an internal command signal to be outputted to the memory controller when the state of the command test enable signal is an enable state.

25. A method for testing a memory system, comprising:
at a memory controller, applying a command signal and a mode setting code for a mode setting command to a semiconductor memory device;
at the semiconductor memory device, receiving the command signal and the mode setting code to set a state of a command test enable signal and a state of a memory cell test enable signal;
at the memory controller, applying a command signal and an address to the semiconductor memory device; and
at the semiconductor memory device, receiving command signals applied from an external portion and generating the received command signals as an internal command signal to be outputted to the memory controller when the state of the command test enable signal is an enable state, and
receiving command signals and an address applied from an external portion and generating the received command signals as an internal command signal to be outputted to the external portion when both the state of the command test enable signal the state of the memory cell enable signal are the enable state and the address is a set address.

* * * * *

UNITED STATES PATENT AND TRADEMARK OFFICE
CERTIFICATE OF CORRECTION

| | | |
|---|---|---|
| PATENT NO. | : 7,634,697 B2 | Page 1 of 1 |
| APPLICATION NO. | : 11/853107 | |
| DATED | : December 15, 2009 | |
| INVENTOR(S) | : Kae-Won Ha et al. | |

It is certified that error appears in the above-identified patent and that said Letters Patent is hereby corrected as shown below:

Title Page, insert the following:

-- (30) Foreign Application Priority Data

Sept. 11, 2006   (KR) ........................ 10-2006-0087481 --.

Signed and Sealed this

First Day of June, 2010

David J. Kappos
*Director of the United States Patent and Trademark Office*